US011152283B2

(12) United States Patent
Franz et al.

(10) Patent No.: US 11,152,283 B2
(45) Date of Patent: Oct. 19, 2021

(54) RACK AND ROW-SCALE COOLING

(71) Applicant: HEWLETT PACKARD ENTERPRISE DEVELOPMENT LP, Houston, TX (US)

(72) Inventors: John Franz, Tomball, TX (US); Harvey J. Lunsman, Chippewa Falls, WI (US); Tahir Cader, Spokane Valley, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/192,576

(22) Filed: Nov. 15, 2018

(65) Prior Publication Data

US 2020/0161214 A1    May 21, 2020

(51) Int. Cl.
| | |
|---|---|
| *H01L 23/473* | (2006.01) |
| *G06F 1/20* | (2006.01) |
| *F04B 43/04* | (2006.01) |
| *F04B 19/00* | (2006.01) |
| *F04B 53/08* | (2006.01) |

(52) U.S. Cl.
CPC ............ *H01L 23/473* (2013.01); *G06F 1/20* (2013.01); *F04B 19/006* (2013.01); *F04B 43/043* (2013.01); *F04B 53/08* (2013.01)

(58) Field of Classification Search
CPC ........ H01L 23/473; G06F 1/20; F04B 19/006; F04B 43/043; F04B 53/08
USPC ........................................................ 361/699
See application file for complete search history.

(56) References Cited

U.S. PATENT DOCUMENTS

| | | | | |
|---|---|---|---|---|
| 5,220,804 A | * | 6/1993 | Tilton | B64G 1/50 257/E23.088 |
| 5,297,005 A | * | 3/1994 | Gourdine | H05K 7/20154 361/695 |
| 5,422,787 A | * | 6/1995 | Gourdine | H05K 7/20154 361/695 |

(Continued)

FOREIGN PATENT DOCUMENTS

| | | |
|---|---|---|
| DE | 20313438 U1 | 2/2005 |
| JP | 2004-092610 A | 3/2004 |

OTHER PUBLICATIONS

P Verma et al., "Design and Development of a Modular Valveless Micropump on a Printed Circuit Board for Integrated Electronic Cooling," Abstract, Jan. 16, 2009, pp. 1-4 (online), SAGE Journals, Retrieved from the Internet on Aug. 9, 2018 at URL: <journals.sagepub.com/doi/abs/10.1243/09544062JMES1315?journalCode=picb>.

(Continued)

*Primary Examiner* — Anatoly Vortman
(74) *Attorney, Agent, or Firm* — McDermott Will & Emery

(57) ABSTRACT

Systems and devices for cooling servers are provided. In one aspect, a cooling device includes a first axial pump including a body having an impeller, the first axial pump coupled to a first pump housing, the first axial pump housing coupled to a chassis, a rack, a row of racks, or one or more racks of the row of racks that are housing one or more servers. The cooling device also includes an inlet pipe coupled to an inlet of the first pump housing, the inlet pipe supplying cooling fluid to the first axial pump. The cooling device also includes an outlet pipe having an outlet coupled to the first pump housing, the outlet pipe receiving the cooling fluid from the first axial pump.

11 Claims, 6 Drawing Sheets

(56) References Cited

U.S. PATENT DOCUMENTS

| | | | |
|---|---|---|---|
| 5,497,825 A * | 3/1996 | Yu | G06F 1/20 165/11.1 |
| 5,559,673 A * | 9/1996 | Gagnon | G06F 1/20 165/122 |
| 5,566,377 A * | 10/1996 | Lee | G06F 1/20 165/80.3 |
| 5,692,882 A | 12/1997 | Bozeman et al. | |
| 5,876,278 A * | 3/1999 | Cheng | G06F 1/20 361/695 |
| 5,917,698 A * | 6/1999 | Viallet | H05K 7/20172 165/80.3 |
| 6,113,485 A * | 9/2000 | Marquis | G06F 1/20 165/121 |
| 6,148,907 A * | 11/2000 | Cheng | H05K 7/20154 165/121 |
| 6,288,897 B1 * | 9/2001 | Fritschle | G06F 1/20 165/122 |
| 6,402,612 B2 * | 6/2002 | Akhtar | F24F 7/007 181/224 |
| 6,527,521 B2 | 3/2003 | Noda | |
| 6,567,267 B1 * | 5/2003 | Wang | G06F 1/20 174/16.1 |
| 6,755,626 B2 | 6/2004 | Komatsu et al. | |
| 6,885,555 B2 * | 4/2005 | Greco | H01L 23/467 165/104.11 |
| 6,920,044 B2 * | 7/2005 | Lin | G06F 1/20 165/80.3 |
| 6,940,716 B1 * | 9/2005 | Korinsky | G06F 1/20 165/121 |
| 7,177,151 B2 * | 2/2007 | Van Lear | F04D 25/04 165/104.33 |
| 7,217,086 B2 * | 5/2007 | Seko | F04D 5/002 415/177 |
| 7,229,258 B2 * | 6/2007 | Wood | A61M 1/1015 417/355 |
| 7,420,804 B2 | 9/2008 | Leija et al. | |
| 7,548,421 B2 * | 6/2009 | Malone | H05K 7/20145 361/695 |
| 7,643,301 B1 * | 1/2010 | Yu | G06F 1/20 361/679.49 |
| 7,813,121 B2 * | 10/2010 | Bisson | H05K 7/20736 361/679.5 |
| 7,813,129 B2 * | 10/2010 | Van Der Werff | H05K 7/20727 361/679.48 |
| 7,882,624 B2 | 2/2011 | Hu et al. | |
| 8,192,177 B2 * | 6/2012 | Chin | F04D 25/045 361/695 |
| 8,430,156 B2 | 4/2013 | Malone et al. | |
| 8,963,396 B2 | 2/2015 | Benner, Jr. | |
| 9,223,362 B2 | 12/2015 | Watanabe et al. | |
| 9,625,220 B1 * | 4/2017 | Ahbel | F28F 27/02 |
| 9,810,207 B2 | 11/2017 | Daidzic | |
| 9,909,588 B2 | 3/2018 | Choudhuri | |
| 2001/0011007 A1 * | 8/2001 | Akhtar | F24F 7/007 454/338 |
| 2003/0051859 A1 | 3/2003 | Chesser et al. | |
| 2004/0079100 A1 | 4/2004 | Monfarad | |
| 2005/0135942 A1 | 6/2005 | Wood et al. | |
| 2006/0051222 A1 | 3/2006 | Lee et al. | |
| 2006/0185830 A1 | 8/2006 | Duan | |
| 2007/0145855 A1 | 6/2007 | Liu et al. | |
| 2007/0227707 A1 | 10/2007 | Machiroutu et al. | |
| 2007/0295477 A1 | 12/2007 | Mueller et al. | |
| 2008/0013283 A1 | 1/2008 | Gilbert et al. | |
| 2008/0038122 A1 | 2/2008 | Kikuchi et al. | |
| 2008/0239612 A1 | 10/2008 | Zhang et al. | |
| 2008/0239672 A1 | 10/2008 | Ghoshal et al. | |
| 2009/0009968 A1 | 1/2009 | Hongo | |
| 2010/0025010 A1 | 2/2010 | Cipolla et al. | |
| 2011/0162821 A1 | 7/2011 | Manzer | |
| 2013/0297074 A1 * | 11/2013 | Todor | A61B 17/1626 700/275 |
| 2019/0072334 A1 | 3/2019 | Xiao | |
| 2019/0111862 A1 | 4/2019 | Dede | |
| 2019/0128271 A1 | 5/2019 | Campbell et al. | |
| 2019/0140493 A1 | 5/2019 | Takahashi | |
| 2019/0320548 A1 | 10/2019 | Gao | |
| 2019/0331019 A1 | 10/2019 | Wang | |
| 2020/0053916 A1 | 2/2020 | Bonnin et al. | |

OTHER PUBLICATIONS

Wikipedia, "Rim-driven thruster", available online at <https://en.wikipedia.org/wiki/Rim-driven_thruster>, Apr. 2017, 1 page.

Idex Corporation, "Drive Technology," 2018, pp. 1-2 (online), Retrieved from the Internet on Oct. 4, 2018 at URL: <micropump.com/technology_drives_technology.aspx>.

Flowlink BV, "X-Series Micro Gear Pumps," 2017, 1-Page (online), Retrieved from the Internet on Jul. 1, 2018 at URL: <flowlink.nl/product-detail/x-series-micro-gear-pumps/>.

Engineering ToolBox, "Pump Affinity Laws" available online at <https://www.engineeringtoolbox.com/affinity-laws-d_408.html>, 2003, 4 pages.

* cited by examiner

RACK AND ROW-SCALE COOLING

BACKGROUND

Rack and row-scale coolant distribution unit (CDU) solutions and system level configurations are limited and inefficiently packaged due to the lack of pump options. Conventional centrifugal pump-based solutions are large and, while efficient in operation, are not optimized for packaging in rack and row-based spaces available. Instead, conventional centrifugal pump-based solutions are better suited for larger open spaces such as in end-or-row CDUs, as opposed to areas where information technology (IT) equipment space is at a premium. With rack and row-scale powers rising rapidly, the industry can no longer efficiently scale with the current centrifugal pump-based solutions, as these systems will need to grow further in order to accommodate the rising power levels. Therefore, there is a need for space-efficient pumps to enable new rack and row-scale packaging options for both the CDU and the equipment it supports, while also offering more performance, higher density, better redundancy, service, and lower costs.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

Figure 1:
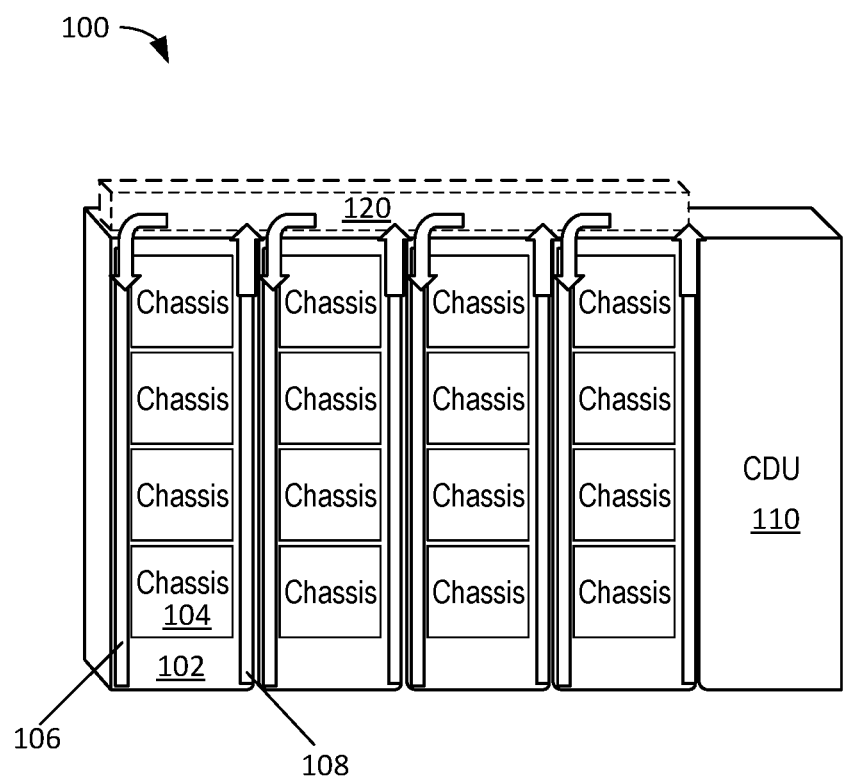
FIG. 1 illustrates a conventional CDU cooling system.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

As discussed above, rack and row-scale coolant distribution unit (CDU) solutions and system level configurations are limited and inefficiently packaged due to the lack of pump options. Conventional centrifugal pump-based solutions are large and, while efficient in operation, are not optimized for packaging in rack and row-based spaces available. Instead, conventional centrifugal pump-based solutions are better suited for larger open spaces such as in end-or-row CDUs, as opposed to areas where information technology (IT) equipment space is at a premium. With rack and row-scale powers rising rapidly, the industry can no longer efficiently scale with the current centrifugal pump-based solutions, as these systems will need to grow further in order to accommodate the rising power levels. Therefore, there is a need for space-efficient pumps to enable new rack and row-scale packaging options for both the CDU and the equipment it supports, while also offering more performance, higher density, better redundancy, service, and lower costs.

Disclosed are pumps and pump systems that are scaled to fit in within at least one of a chassis, a rack, a row of racks, or one or more racks of the row of racks housing one or more servers, or in a space above the one or more racks or the row of racks. The pumps may include impellers configured to rotate in a circumferential motion around an axis with a longitudinal axis of the pumps. Each pump may be coupled to a pump housing that is coupled to inlet and outlet pipes for delivering cooling fluid to cool the one or more servers. According to certain implementations, a first pump may be coupled in series or in parallel to a second pump.

The sizing of the pumps allows for improved scalability without compromising cooling performance. Additionally, assembling the pumps in series and/or parallel configurations provides flexibility for different cooling needs.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

Conventional System Architecture

FIG. 1 illustrates a conventional server system architecture 100 (e.g., a row-scale architecture that includes servers in chassis and racks) with a conventional cooling distribution unit (CDU) 110. The architecture 100 includes several server racks 102. Each server rack 102 includes multiple chassis (e.g., chassis 104). As illustrated, the CDU 110 resides outside of the server racks 102. The CDU 110 supplies cooled cooling fluid 106 into the server racks 102 and receives heated cooling fluid 108 from the server racks 102. For example, the CDU 110 can be 800 mm wide and can support up to four server racks 102 up to 250 kW each utilizing a conventional centrifugal pump.

As illustrated, there is empty space 120 located at the plenum of the architecture 100 that is not occupied by pipes delivering and returning coolant, cables, etc. It is understood that although the empty space 120 is illustrated at the top plenum of the architecture 100, the empty space 120 can be located in other locations within each rack and/or row of each chassis 104, and/or below (e.g., under floor tiles) each server rack 102. It is understood by persons skilled in the art that the CDU 110 includes large pumps (in addition to many other elements), which are too large to fit within the empty space 120.

With regards to server technology, space comes at a premium and, especially with rack and row-scale powers rising rapidly, the industry can no longer afford to utilize current space-inefficient centrifugal pump-based solutions. Therefore, there is a need for space-efficient pumps that enable rack and row-scale packaging options for both the CDU and the equipment it supports, while also offering more performance, higher density, better redundancy, service, and lower costs.

Example Pump System

Figure 2:
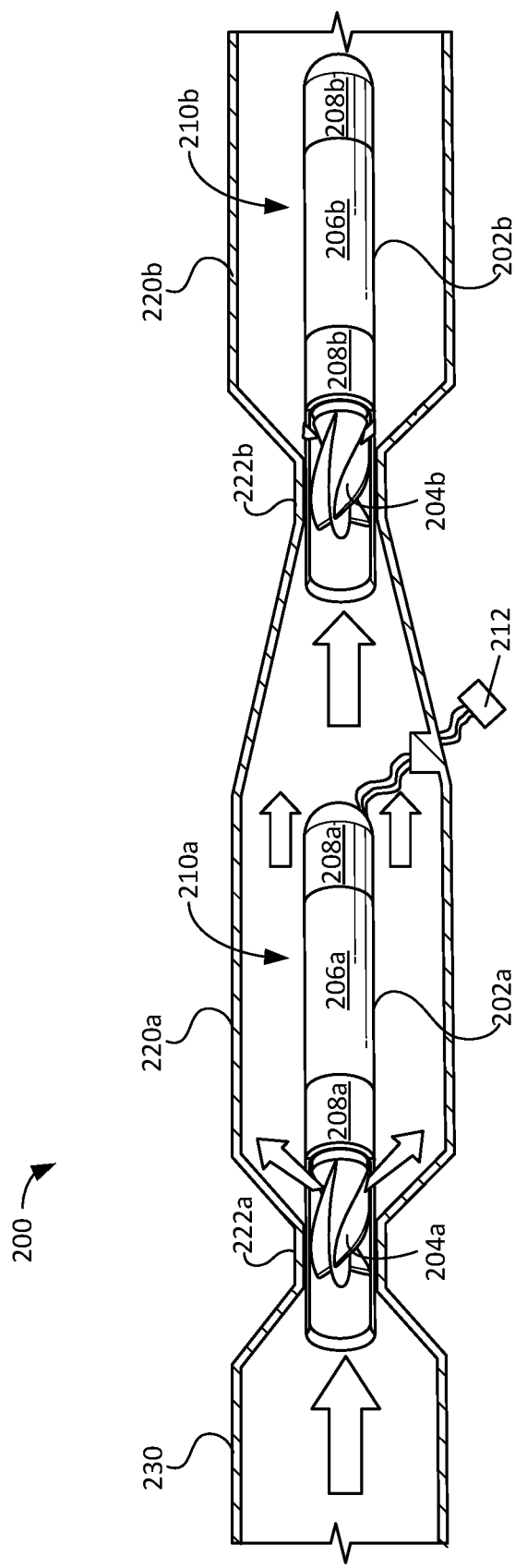
FIG. 2 illustrates an example pump system, according to certain aspects of the disclosure.

FIG. 2 illustrates an example pump system 200 (e.g., a pump assembly) that satisfies the needs described above. The system 200 can be implemented in several ways, including, but not limited to, by itself, in conjunction with a CDU (e.g., as a booster pump), as part of a CDU, etc. The pump system 200 includes a pump 210a (e.g., a first axial pump) coupled to a pump housing 220a (e.g., a first pump housing). According to an aspect of the present disclosure, the pump 210a includes a body 202a (e.g., a first body) having an impeller 204a (e.g., a first impeller). For example, the impeller 204a is configured to rotate around an axis in a circumferential motion with a longitudinal axis of the body 202a. The pump 210a can also include a motor 206a (e.g., a first motor) disposed between magnetic bearings 208a (e.g., first magnetic bearings). The motor 206a may be powered by a power source 212 that is coupled to the pump 210a externally outside of the pump housing 220a. In some implementations, the motor 206a may further be coupled to a control. According to certain implementations, the motor 206a may be external to the pump housing 220a. For example, both the motor 206a and the power source 212 may be externally outside of the pump housing 220a.

According to an aspect of the present disclosure, the pump 210a can be incorporated into a coolant distribution unit (CDU) device as a pump for cooling one or more servers. For example, an inlet pipe 230 can be coupled to an inlet 222a (e.g., a first inlet) of the pump housing 220a such that the inlet pipe 230 supplies cooling fluid to the pump 210a. The cooling fluid can flow along a predominantly linear path (e.g., a substantially straight line), as denoted by the arrows, through the inlet pipe 230, into the impeller 204a, and through the pump housing 220a. According to an aspect, the inlet pipe 230 and an outlet (e.g., pump housing 220b) may have a same direction of flow for the cooling fluid. For example, a direction of flow at the inlet pipe 230 may be the same as the direction of flow at the outlet. Because the cooling fluid is supplied to the pump 210a through a linear path, space is saved as compared to conventional solutions, where the cooling fluid goes through many turns, connections and transitions (e.g., 90 degree turns). This allows for the pump 210a to be sized such that a CDU that incorporates the pump 210a can fit within a wider range of locations for cooling one or more heat generating devices (e.g., servers, switches, power supplies, other items in an IT rack, etc.). For example, the pump 210a may be coupled to/within a chassis, a rack, a row of racks, or one or more racks of the row of racks that are housing the one or more servers to provide chassis, rack, and/or row level cooling to the one or more servers. In an implementation, the pump housings (e.g., pump housing 220a and pump housing 220b) may be coupled to/within a housing of one or more servers. For example, the pump housings may be coupled to/within a chassis, a rack, a row of racks, or one or more racks that are housing the one or more servers, or in a space above the one or more racks or the row of racks.

According to an aspect, a length of the pump 210a is larger than a diameter of the pump 210a. For example, the length of the pump 210a can be 10 inches and a diameter of the pump 210a can be one inch. According to an aspect, a diameter of the pump housing 220a is four inches (e.g., a diameter of four inches). According to an aspect, a diameter of the impeller 204a is 2.5 inches. It is understood these dimensions are exemplary only, and other sizes are possible.

According to a further aspect of the present disclosure, the pump system 200 can include another pump 210b (e.g., a second axial pump) coupled in series with the first pump 210a. Alternatively, the second pump 210b can be coupled parallel to the first pump 210a. Similar to the first pump 210a, the second pump 210b also includes a body 202b (e.g., a second body), an impeller 204b (e.g., a second impeller), a motor 206b (e.g., a second motor), and magnetic bearings 208b (e.g., second magnetic bearings). The second pump 210b is coupled to a pump housing 220b (e.g., a second pump housing). For example, the first pump housing 220a can be coupled to the second pump housing 220b through an inlet 222b (e.g., a second inlet). In this way, cooling fluid supplied from the inlet pipe 230 can be pumped through the first pump 210a and the second pump 210b in a substantially linear path. For example, a direction of flow may be the same through the first pump 210a and the second pump 210b.

According to an additional aspect of the present disclosure, a third pump (not shown) can be coupled either in series or in parallel to the first pump 210a. For example, the third pump can be coupled parallel to the first pump 210a, as shown below in FIG. 3, or can be coupled to an output of the second pump 210b (e.g., in series with the first pump 210a). The third pump can include all the parts described above in relation to the first pump 210a and the second pump 210b, and can be coupled to a third pump housing.

It is understood that the pumps described herein may include all types of pumps known in the art, including, but not limited to, axial-flow pumps (e.g., axial pumps).

Figure 3:
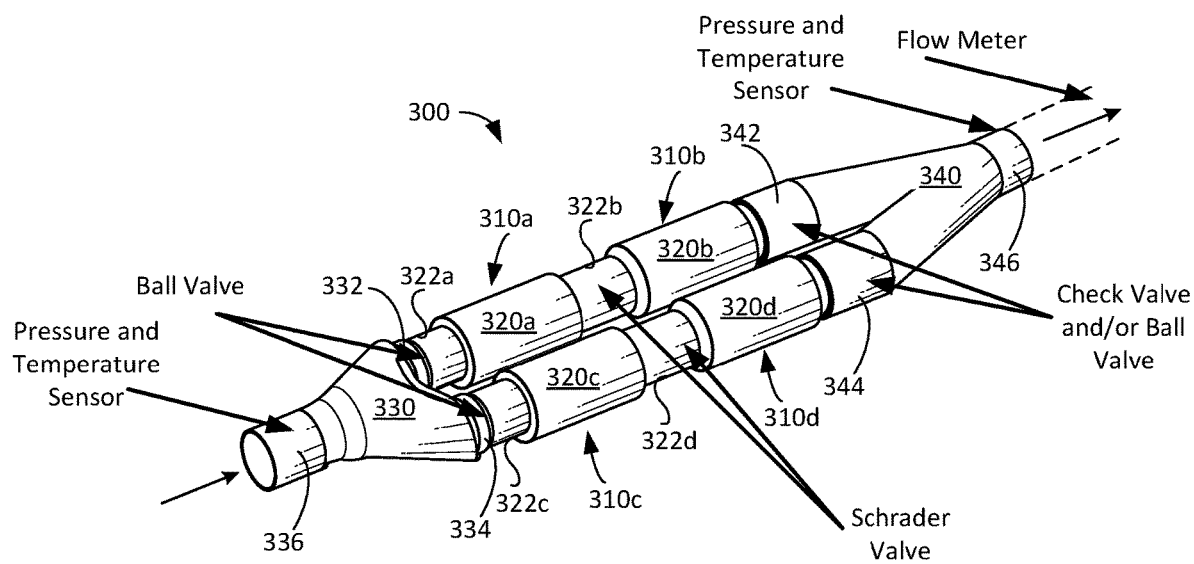
FIG. 3 illustrates an example pump system, according to certain aspects of the disclosure.

FIG. 3 illustrates a pump system 300 having pumps (e.g., axial pumps) in series and in parallel according to certain aspects of the disclosure. The system 300 can be implemented in several ways, including, but not limited to, by itself, in conjunction with a CDU (e.g., as a booster pump), as part of a CDU, etc. The system 300 includes a first pump (e.g., a first axial pump) 310a coupled to a first pump housing 320a, a second pump 310b (e.g., a second axial pump) coupled to a second pump housing 320b, a third pump 310c (e.g., a third axial pump) coupled to a third pump housing 320c, and a fourth pump 310d (e.g., a fourth axial pump) coupled to a fourth pump housing 320d. For example, the first pump 310a can be coupled in series with the second pump 310b, and the third pump 310c can be coupled in series with the fourth pump 310d, as illustrated above in FIG. 2. The first pump 310a can be coupled in parallel to the third pump 310c, and the second pump 310b can be coupled in parallel to the fourth pump 310d.

According to an aspect of the present disclosure, cooling fluid is supplied to the system 300 through an intake 336 of an inlet pipe 330. For example, the inlet pipe 330 can be Y-shaped, having the intake 336, a first outlet 332, and a second outlet 334. The cooling fluid can be diverted through the inlet pipe 330 through two paths, a first path through the first pump 310a and the second pump 310b, and a second path through the third pump 310c and the fourth pump 310d. For example, the first outlet 332 of the inlet pipe 330 can be coupled to a first inlet 322a of the first pump housing 320a, and the first pump housing 320a can be coupled to a second inlet 322b of the second pump housing 320b. The second pump housing 320b can be coupled to an outlet pipe 340 through an outlet 342 (e.g. a first outlet). For example, the outlet pipe 340 can be Y-shaped and can include the first outlet 342, a second outlet 344, and an output 346.

Similarly, the second outlet 334 of the inlet pipe 330 can be coupled to a third inlet 322c of the third pump housing 320c, and the third pump housing 320c can be coupled to a fourth inlet 322d of the fourth pump housing 320d. The fourth pump housing 320d can be coupled to the outlet pipe 340 through the second outlet 344. The cooling fluid travelling along the first path and the second path merge together at the output 346. In this way, the outlet pipe 340 receives the cooling fluid from the pump system 300.

The disclosed system 300 may also include check valves, ball valves, Schrader valves, flow meters, temperature sensors, pressure sensors, manual valves for service, drain fittings, etc. Additionally, it is understood that all of the parts of the system 300 are modular, and may be attached or removed as desired. It is understood by persons having ordinary skill in the art that the disclosed pump system 300 may include additional elements that may not be labelled or illustrated.

Figure 4:
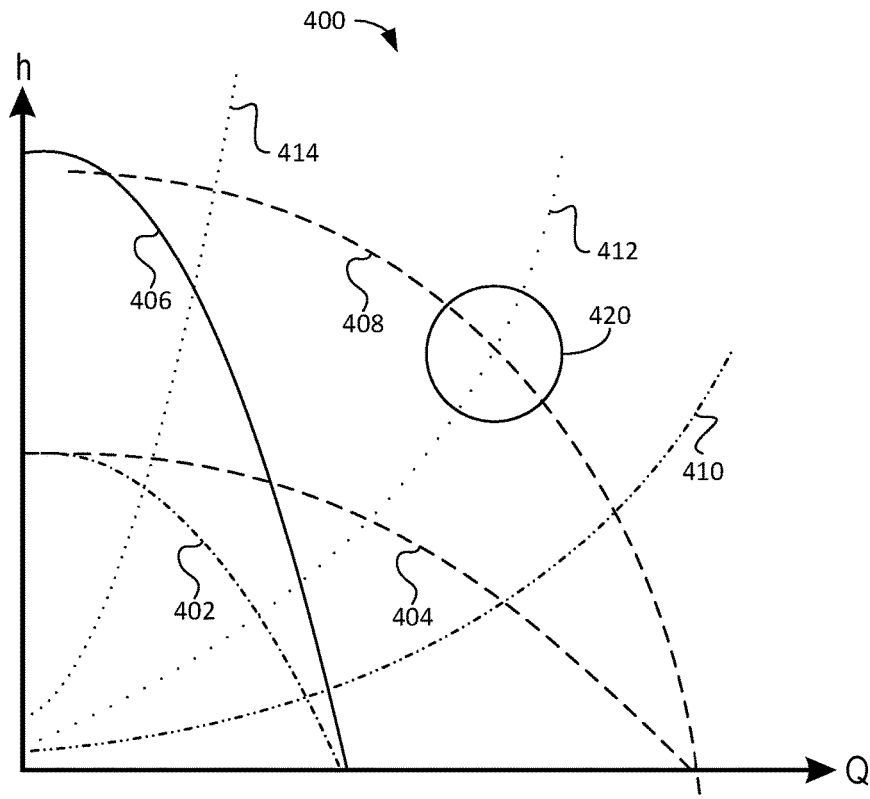
FIG. 4 illustrates a performance chart of different implementations of pumps, according to certain aspects of the disclosure.

FIG. 4 illustrates a performance chart 400 of different implementations of the pump system of FIG. 3, according to certain aspects of the disclosure. For example, the chart 400 is a plot of a correlation of Q (e.g., a flow) to h (e.g., a head or pressure) for the pumps. A single pump configuration result is shown in curve 402. Two pumps in a parallel configuration results in curve 404. Two pumps in series, as illustrated in FIG. 2, results in curve 406. Four pumps, two in series and two parallel, as illustrated in FIG. 3, results in curve 408.

Although four curves 402-408 are shown for different pump configurations, it is understood that any configuration is capable of supplying a desired flow and pressure, depending on the situation. For example, one pump is capable of providing the flow and pressure to support 1MW of cooling (e.g., 300 gallons per minute "gpm'). Different configurations are allowed, and the four curves 402-408 illustrate the versatility of the pumps.

Upward curves 410, 412, and 414 represent pressure drop versus flow rate. For example, upward curve 412 represents a pressure drop for curve 408, and intersection point 420 represents a resistance that would be experienced through a plumbing network for four pumps, two in series and two parallel, configuration.

Example Cooling System

Figure 5:
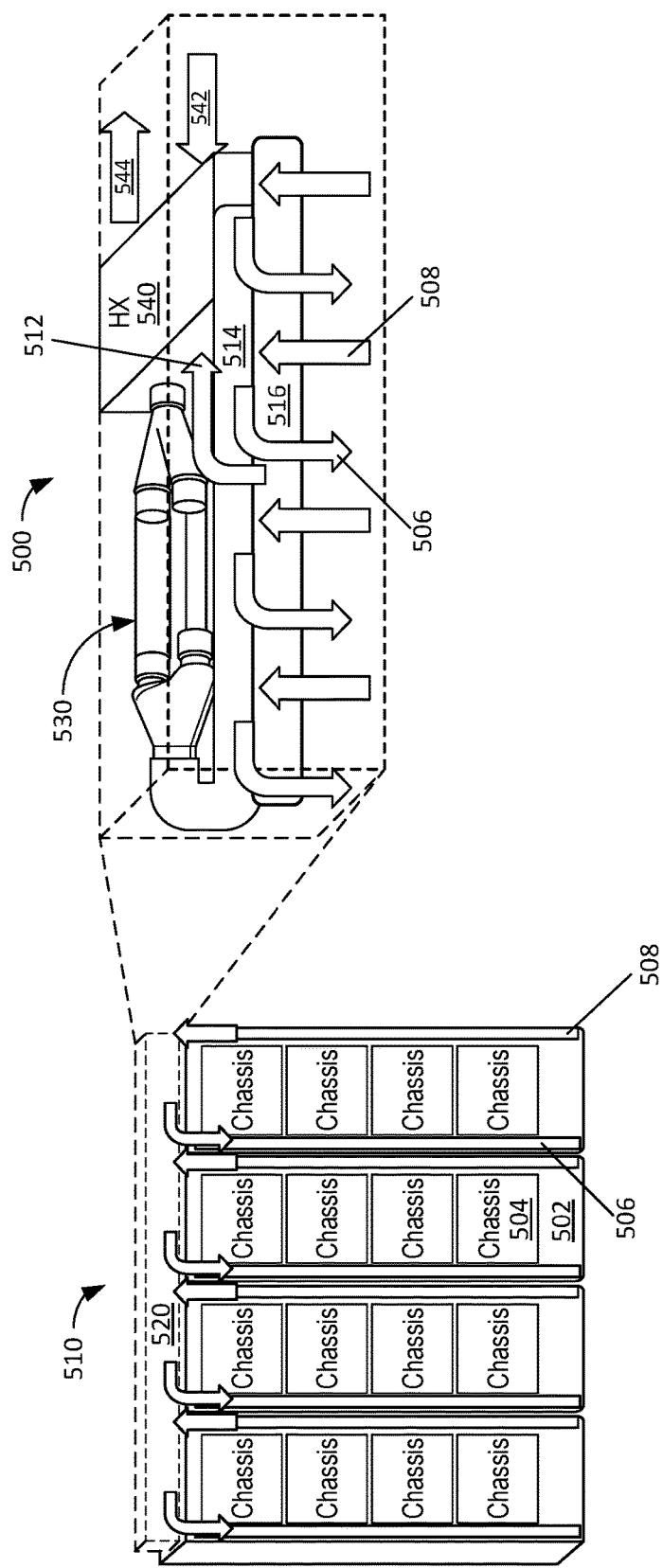
FIG. 5 illustrates an example cooling system configured with an pump system, according to certain aspects of the disclosure.

FIG. 5 illustrates an example cooling system 500 configured with a pump system 530, according to certain aspects of the disclosure. For example, the cooling system 500 can fit above a rack 502 in an empty space 520 (e.g., as illustrated in FIG. 5), or coupled to/within a chassis 504, a rack 502, a row of racks, one or more racks of the row of racks, or below the rack 502 (e.g., under floor tiles or underground). For example, the cooling system 500 provides cooling to the chassis 504, the rack 502, the row of racks, and/or one or more racks of the row of racks housing one or more servers 510. The cooling system 500 can be implemented in several ways, including, but not limited to, by itself, in conjunction with a CDU (e.g., as a booster pump), as part of a CDU, etc.

According to an aspect of the present disclosure, the cooling system 500 includes the pump system 530, a heat exchanger (HX) 540, a first input pipe 542, a first output pipe 544, a second output pipe 514, and a second input pipe 516 from the heat exchanger 540. For example, the pump system 530 can include any combination of pumps in series and/or parallel configurations as described above in FIGS. 2 and 3. The pump system 530 can be coupled to/within the chassis 504, the rack 502, the row of racks, and/or one or more racks of the row of racks housing one or more servers 510.

In operation, the heat exchanger 540 is connected to a primary loop from a facility for cooling fluid from the first input pipe 542, and outputs heated cooling fluid out of the first output pipe 544. The pump system 530 facilitates pumping the cooled cooling fluid and the heated cooling fluid into and out of the heat exchanger 540. Additionally, the pump system 530 facilitates supplying cooled cooling fluid 506 from the cooling system 500 into the racks 502 and receiving heated cooling fluid 508 from the racks 502. For example, the second output pipe 514 supplies the cooled cooling fluid 506, and the second input pipe 516 receives the heated cooling fluid 508. A heat exchange 512 can occur between a rack side loop and a facility side loop.

Figure 6:
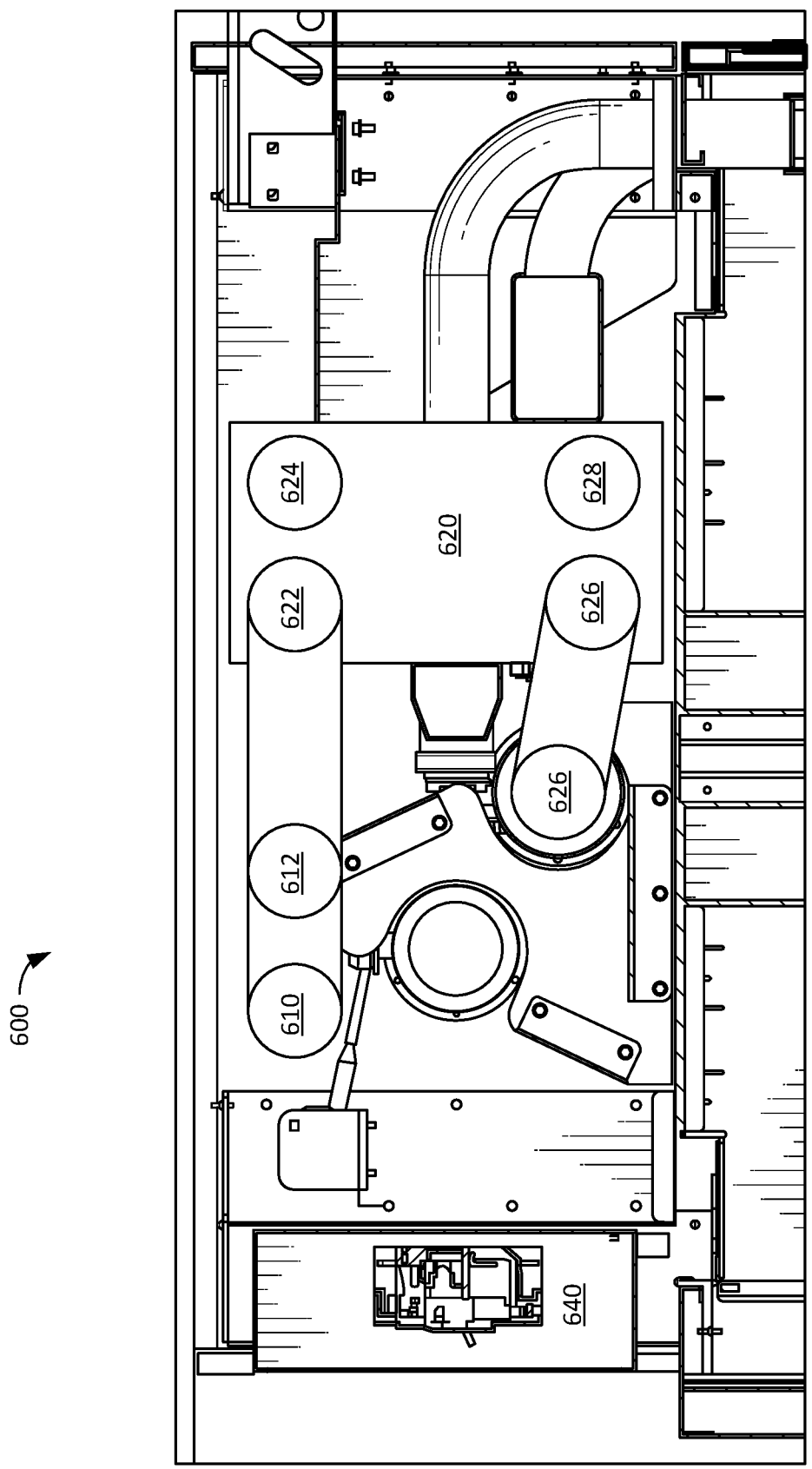
FIG. 6 illustrates a cross-sectional side view of an example cooling system in one or more servers, according to certain aspects of the disclosure.

FIG. 6 illustrates a cross-sectional side view of an example cooling system 600, according to certain aspects of the disclosure. For example, the system 600 can include a first pump 610, a second pump 612, and a heat exchanger 620. The heat exchanger 620 can include a first pipe 622, a second pipe 624, a third pipe 626, and a fourth pipe 628. The system 600 can also include a power junction box 640. For example, the power junction box 640 may determine a maximum height of the plenum of one or more servers, such that the dimensions of the system 600 are within the maximum allowed ceiling or under floor heights above or below the rack. According to an aspect, the maximum height may be around 20 inches. It is understood that this value is exemplary only, and other heights are possible.

According to an aspect of the present disclosure, the first pump 610 and the second pump 612 are in a parallel configuration. According to an additional aspect, the first pipe 622 and the third pipe 626 are coupled to one or more servers in an internal loop (e.g., a secondary loop), and the second pipe 624 and the fourth pipe 628 are coupled to the heat exchanger 620 in an external loop (e.g., a primary loop). According to further aspects of the present disclosure, each of the pipes 622-628 are four inches in diameter, and the heat exchanger 620 is a 1MW L2L HX with dimensions of 10"×24"×15". It is understood that these dimensions are exemplary only, and other dimensions for the pipes 622-628 and heat exchanger 620 are possible.

Figure 7:
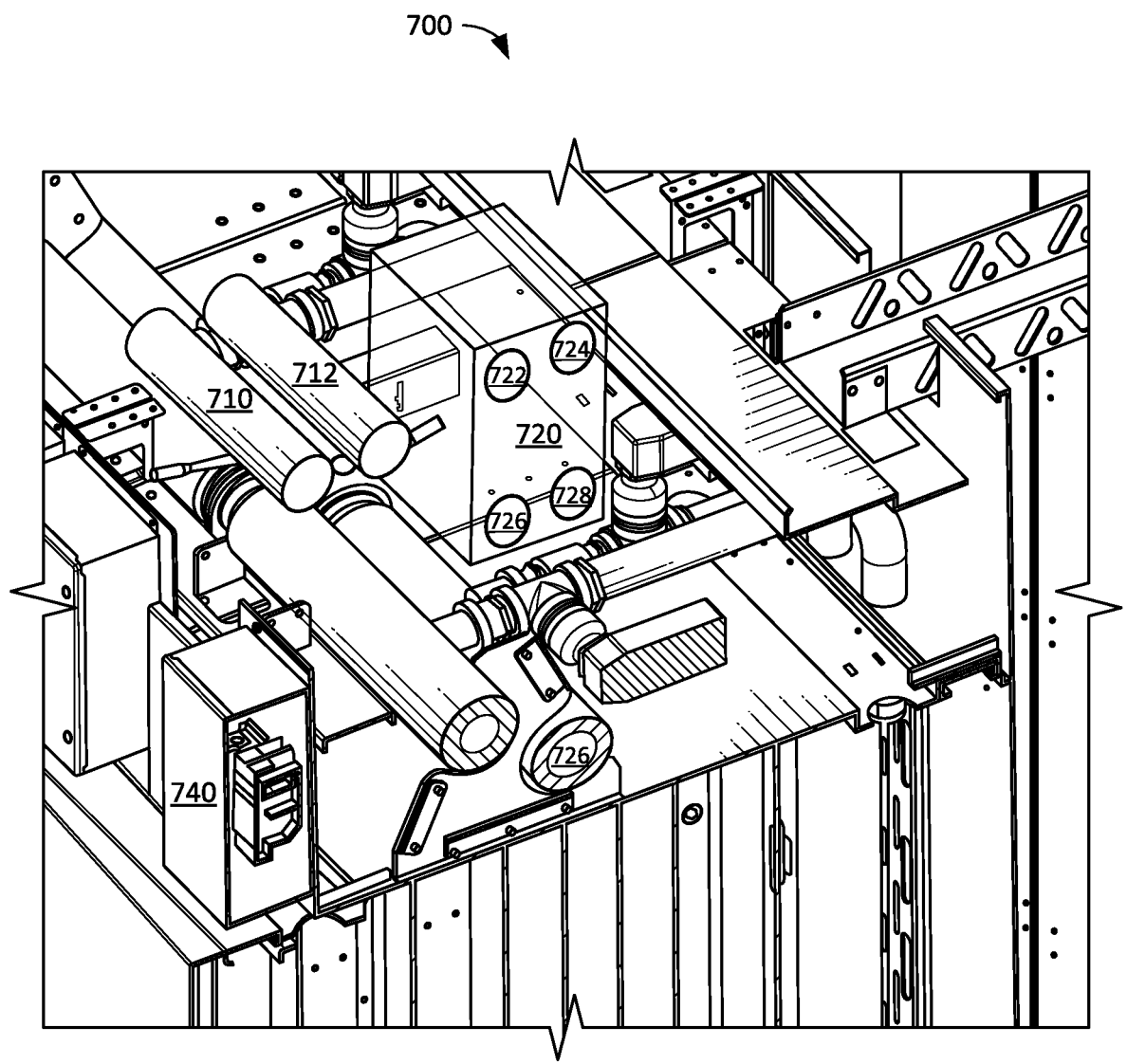
FIG. 7 illustrates a cross-sectional perspective view of an example cooling system in one or more servers, according to certain aspects of the disclosure.

FIG. 7 illustrates a cross-sectional perspective view of an example cooling system 700, according to certain aspects of the disclosure. For example, the system 700 can include a first pump 710, a second pump 712, and a heat exchanger 720. The heat exchanger 720 can include a first pipe 722, a second pipe 724, a third pipe 726, and a fourth pipe 728. The system 700 can also include a power junction box 740.

According to an aspect of the present disclosure, the first pump 710 and the second pump 712 are in a parallel configuration. According to an additional aspect, the first pipe 722 and the third pipe 726 are coupled to one or more servers in an internal loop (e.g., a secondary loop), and the second pipe 724 and the fourth pipe 728 are coupled to the heat exchanger 720 in an external loop (e.g., a primary loop).

As described herein, advantages of the systems and devices includes a dramatic size reduction as compared to conventional centrifugal solutions. For example, pipe connections used at the CDU system level are more efficient with inline axial pumps, as opposed to conventional centrifugal pumps, which results in system level volume reduction. There are flow efficiency benefits as well because there are fewer pipe bends, which also results in cost and leak risk benefits due to fewer pipe connections/transitions.

Additionally, including the CDU equipment on the top of the racks increases solution density by 25%. For example, as illustrated in FIG. 1, conventional solutions utilize a single CDU rack to support four IT racks. In contrast, the disclosed systems and devices integrate equipment on top of the racks (e.g., where plumbing already resides) and saves one rack (e.g., out of four), which may result in a 25% reduction in utilized floor space.

Space reduction by the pumps allows for additional advantages, including the ability to arrange pumps in series and parallel pump configurations for improved performance and resilience (e.g., reduced maintenance). At a server level, the pumps described herein add the ability to act as booster pumps in line with any existing CDU equipment. This offers upgraded performance at minimal cost and complexity to extend the life of systems. A booster pump can be deployed at different scales (e.g., chassis, rack, row) to provide resiliency benefits in the event of row level CDU failure or service. Furthermore, the booster pump scenario can provide new options to place IT equipment (e.g., servers, storage, and networking) and CDUs in placement configurations, providing mutual benefit to both CDU equipment and IT equipment. This is because the pumps are closer to the heat source and the pumps are therefore not placed between racks, which reduces cable lengths and service complications. This helps to optimize cable lengths and routing to reduce costs and improve system data performance. The benefits also include the ability to remove pumps from the circuit while the rest of the system is operational because of the created parallel paths of flow.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference. Furthermore, to the extent that the term "include," "have," or the like is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." Pronouns in the masculine (e.g., his) include the feminine and neuter gender (e.g., her and its) and vice versa. The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A cooling device, comprising:
   a first axial pump comprising a first body having a first impeller, the first axial pump coupled to a first pump housing, the first pump housing coupled at a first end thereof to a heat exchanger and at a second end thereof to at least one of a chassis, a rack, a row of racks, or one or more racks of the row of racks that are housing multiple servers, the heat exchanger, in operation, to receive a cooling fluid that is heated and provide, after cooling, the cooling fluid for reuse in a closed loop operation;
   a first inlet pipe coupled to a first inlet of the first pump housing, the first inlet pipe supplying the cooling fluid received from the heat exchanger to the first axial pump;
   a first outlet pipe comprising a first outlet coupled to the first pump housing, the first outlet pipe receiving the cooling fluid from the first axial pump; and
   a second axial pump coupled in series to the first axial pump, the second axial pump comprising a second body having a second impeller, the second axial pump coupled to a second pump housing, the second pump housing coupled to the at least one of the chassis, the rack, the row of racks, or the one or more racks of the row of racks that are housing the multiple servers, the second axial pump receiving the cooling fluid from the first outlet pipe.

2. The cooling device of claim 1, wherein a length of the first axial pump is larger than a diameter of the first axial pump.

3. The cooling device of claim 1, wherein a length of the first axial pump is 10 inches and a diameter of the first axial pump is one inch.

4. The cooling device of claim 1, further comprising a third axial pump coupled either in series or in parallel to the first axial pump.

5. The cooling device of claim 4, wherein the third axial pump is coupled to a third pump housing.

6. The cooling device of claim 1, further comprising a motor powered by a power source that is coupled to at least the first axial pump externally outside of at least the first pump housing.

7. The cooling device of claim 1, wherein the first inlet pipe and the first outlet pipe have a same direction of flow for the cooling fluid.

8. A cooling system, comprising:
   a heat exchanger, in operation, to receive a cooling fluid that is heated and provide, after cooling, the cooling fluid for reuse in a closed loop operation;
   a first axial pump coupled to the heat exchanger, the first axial pump comprising a first body having an impeller, the first axial pump coupled to a first pump housing, the first pump housing coupled to a chassis, a rack, a row of racks, or one or more racks of the row of racks that are housing multiple servers;
   a first inlet pipe coupled to a first inlet of the first pump housing, the inlet pipe supplying the cooling fluid received from the heat exchanger to the first axial pump;
   a first outlet pipe comprising a first outlet coupled to the first pump housing, the outlet pipe receiving the cooling fluid from the first axial pump; and
   a second axial pump coupled in series to the first axial pump, the second axial pump comprising a second body having a second impeller, the second axial pump coupled to a second pump housing, the second pump housing coupled to the at least one of the chassis, the rack, the row of racks, or the one or more racks of the row of racks that are housing the multiple servers, the second axial pump receiving the cooling fluid from the first outlet pipe.

9. The cooling system of claim 8, further comprising a third axial pump coupled either in series or in parallel to the first axial pump.

10. The cooling system of claim 9, wherein the third axial pump is coupled to a third pump housing.

11. The cooling system of claim 8, wherein the first inlet pipe and the first outlet pipe have a same direction of flow for the cooling fluid.

* * * * *